US012334167B2

(12) United States Patent
Liu et al.

(10) Patent No.: US 12,334,167 B2
(45) Date of Patent: Jun. 17, 2025

(54) METHOD AND DEVICE FOR TESTING MEMORY

(71) Applicant: CHANGXIN MEMORY TECHNOLOGIES, INC., Hefei (CN)

(72) Inventors: Dong Liu, Hefei (CN); Xikun Chu, Hefei (CN); Tianhao Diwu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 219 days.

(21) Appl. No.: 17/857,235

(22) Filed: Jul. 5, 2022

(65) Prior Publication Data

US 2023/0223098 A1 Jul. 13, 2023

Related U.S. Application Data

(63) Continuation of application No. PCT/CN2022/081496, filed on Mar. 17, 2022.

(30) Foreign Application Priority Data

Jan. 10, 2022 (CN) .......................... 202210021520.5

(51) Int. Cl.
*G11C 29/08* (2006.01)
*G11C 8/08* (2006.01)
*G11C 29/12* (2006.01)

(52) U.S. Cl.
CPC ................ *G11C 29/08* (2013.01); *G11C 8/08* (2013.01); *G11C 2029/1202* (2013.01); *G11C 2029/1204* (2013.01)

(58) Field of Classification Search
CPC ......... G11C 29/54; G11C 7/1051; G11C 8/08; G11C 29/04; G11C 29/50
See application file for complete search history.

(56) References Cited

U.S. PATENT DOCUMENTS

| 9,633,740 | B1 | 4/2017 | Alhussien | |
|---|---|---|---|---|
| 2006/0190208 | A1* | 8/2006 | Behera | G11C 29/56 702/117 |
| 2007/0047355 | A1 | 3/2007 | Benzinger | |
| 2009/0183032 | A1* | 7/2009 | Frey | G11C 29/50 365/201 |
| 2013/0114342 | A1 | 5/2013 | Sakai | |
| 2016/0189801 | A1 | 6/2016 | Yamaguchi et al. | |
| 2016/0372167 | A1* | 12/2016 | Desai | G11C 7/12 |

FOREIGN PATENT DOCUMENTS

| CN | 104094356 A | 10/2014 |
|---|---|---|
| CN | 105518799 A | 4/2016 |
| CN | 107068187 A | 8/2017 |
| CN | 113012745 A | 6/2021 |
| EP | 0884734 A1 | 12/1998 |

* cited by examiner

*Primary Examiner* — Jay W. Radke
(74) *Attorney, Agent, or Firm* — Kilpatrick Townsend & Stockton LLP

(57) ABSTRACT

A method and device for testing a memory are provided. The method includes the following operations. After activating at least one word line, at least two times of read operations are performed on a to-be-tested memory cell connected to the activated word line. Whether there is a read abnormality in the to-be-tested memory cell is determined according to an output signal obtained after the at least two times of read operations.

11 Claims, 7 Drawing Sheets

S101

Perform, after activating at least one word line, at least two times of read operations on a to-be-tested memory cell connected to the activated word line

S102

Determine, according to an output signal obtained after the at least two read operations, whether there is a read abnormality in the to-be-tested memory cell

METHOD AND DEVICE FOR TESTING MEMORY

CROSS-REFERENCE TO RELATED APPLICATION

The present disclosure is a US continuation application of International Application No. PCT/CN2022/081496 filed on Mar. 17, 2022, which is proposed based on Chinese patent application No. 202210021520.5, filed on Jan. 10, 2022 and entitled "METHOD AND DEVICE FOR TESTING MEMORY", and claims priority to the Chinese patent application. The disclosures of the above applications are hereby incorporated by reference in their entirety.

BACKGROUND

In the processes of development and manufacture of the memory, it is often required to perform a large number of tests on the memory to determine whether there is an abnormality generated in the manufacturing process. For example, the leakage or abnormal reading and writing phenomenon, caused by short circuit, poor contact, etc., generated in the product manufacturing process. Due to the sophisticated and complex structure of memory products, a series of electrical tests are required to identify abnormalities. However, because some abnormal situations are not easy to be shown under normal reading and writing conditions and they will affect the service life and the reliability of the product, some more reliable test methods are required to accurately identify the abnormal situations that are not easy to be shown.

SUMMARY

Embodiments of the present disclosure relate to semiconductor manufacturing technologies, and relate to, but are not limited to, a method and device for testing memory.

In view of this, embodiments of the present disclosure provide a method for testing memory and a device for testing memory.

In the first aspect, the embodiments of the present disclosure provide a method for testing a memory. The method includes the following operations.

After activating at least one word line, at least two consecutive read operations are performed on a memory cell connected to the activated at least one word line.

Whether there is a read abnormality in the memory cell is determined according to an output signal obtained after the at least two consecutive read operations.

In a second aspect, the embodiments of the present disclosure provide a device for testing a memory. The device includes a reading module and a testing module.

The reading module is configured to perform, after activating at least one word line, at least two consecutive read operations on a memory cell connected to the activated word line.

The testing module is configured to determine, according to an output signal obtained after the at least two consecutive read operations, whether there is a read abnormality in the memory cell.

BRIEF DESCRIPTION OF THE DRAWINGS

The accompanying drawings, which are incorporated in and constitute a part of this description, illustrate embodiments consistent with the present disclosure and together with the description serve to explain the principles of the present disclosure.

Specific embodiments of the present disclosure have been shown by the above-mentioned drawings, and will be described in more detail hereinafter. These drawings and written descriptions are not intended to limit the scope of the concepts of the present disclosure in any way, but to illustrate the concepts of the present disclosure to those skilled in the art by referring to specific embodiments.

DETAILED DESCRIPTION

Exemplary embodiments will be described in detail herein, examples of which are illustrated in the accompanying drawings. When the following description refers to the drawings, the same numerals in different drawings refer to the same or similar elements unless otherwise indicated. The implementations described in the following exemplary embodiments are not intended to represent all implementations consistent with the present disclosure. Rather, they are merely examples of device and method consistent with some aspects of the present disclosure and detailed description in the appended claims.

Other embodiments of the present disclosure will readily occur to those skilled in the art upon consideration of the description and practice of the invention disclosed herein. The present disclosure is intended to cover any variations, uses or adaptations of the present disclosure that follow the general principles of the present disclosure and include common knowledge or conventional techniques in the technical field not disclosed in the present disclosure. The description and embodiments are to be regarded as exemplary only, and the true scope and spirit of the present disclosure are indicated by the content of the claims. The technical solutions of the present disclosure will be further elaborated below with reference to the accompanying drawings and embodiments.

In the technical solutions of embodiments of the present disclosure, at least two consecutive read operations are performed on the memory cell, and the detection result is determined based on the finally obtained output signal. By at least two consecutive reading, the time for reading can be extended. In the case that there is abnormality in the memory cell, the output signal obtained after multiple consecutive reading can reflect the abnormality more easily, so as to facilitate detection, thereby improving the detection accuracy, reducing the situation of misdetection.

Figure 1:
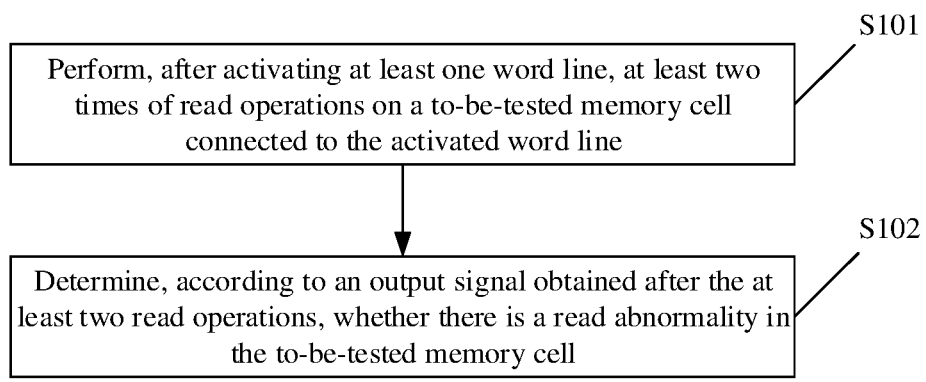
FIG. 1 is the first flowchart of a method for testing a memory according to some embodiments of the present disclosure.

As shown in FIG. 1, some embodiments of the present disclosure provide a method for testing a memory. The method includes the following steps.

In step S101, after activating at least one word line, at least two consecutive read operations are performed on a memory cell connected to the activated word line.

In step S102, whether there is a read abnormality in the memory cell is determined according to an output signal obtained after the at least two consecutive read operations.

For the test of the memory, it is generally implemented by using the read and write operations similar to those in the use of the memory. After the word line is activated, a read operation will be performed. Whether the memory can be read normally is determined by comparing the read voltage level or the read data with the pre-written data, and then abnormal memory cells are detected.

However, some memories may have insufficient performance due to process errors during the manufacturing process. For example, some connection points have poor direct contact, and some wiring has insufficient isolation and thus leakage occurs. During the processes of reading and writing, these failed positions may be able to read and write correctly, or abnormal reading and writing may occur, but correct reading and writing may not occur every time. In addition, due to the existence of leakage, data may be read immediately after writing in the previous test, and the leakage has not affected the whole process, so that it is difficult to detect. The products that are false detected may fail in subsequent use, thereby affecting product reliability.

Therefore, in some embodiments of the present disclosure, the manner of multiple consecutive reading are used in the test process to extend the duration of data collection by the reading operation, the condition for reading the data is deteriorated artificially, so as to make it easier to highlight abnormal situations.

In some embodiments of the present disclosure, after the word line is activated, the memory cell connected to the word line is activated, so that the charge of the connected capacitor or other charge storage node can be transmitted to the connected bit line, and the potential on the bit line is changed accordingly under the sensing action of the sensing amplifier. Here, at least two consecutive read operations are performed, and each read operation will cause charge sharing between the memory cell and a bit line correspondingly connected to the memory cell, thereby affecting the potential on the bit line.

After the above at least two consecutive read operations, the potential on the bit line may be processed by a structure such as a sense amplifier to obtain an output signal. Finally, whether there is a read abnormality in the memory cell can be determined according to whether the output signal satisfies the judgment criteria.

It should be noted that the read abnormality here includes not only the abnormality of the memory cell itself, but also the abnormality of the structures of the circuit elements and wires connected to the memory cell. For example, there is leakage between the bit line and the adjacent bit line, there is leakage between the bit line and the reference bit line, there is leakage between the bit line and the word line, there is abnormality in the contact structure of the memory cell, and there is leakage in the memory capacitor, etc. There may also be an abnormality in the sense amplifier connected to the memory cell or abnormality in various peripheral circuits such as a write signal line.

For a memory cell with the above read abnormality, it may not be recognized because the output data obtained only based on the read still meets the normal judgment standard as the leakage is not obvious. However, in some embodiments of the present disclosure, the leakage situation is amplified by performing the read operation multiple times, so that the final output signal is more easily affected by the leakage and the memory cell with the read abnormality can be recognized.

Figure 2:
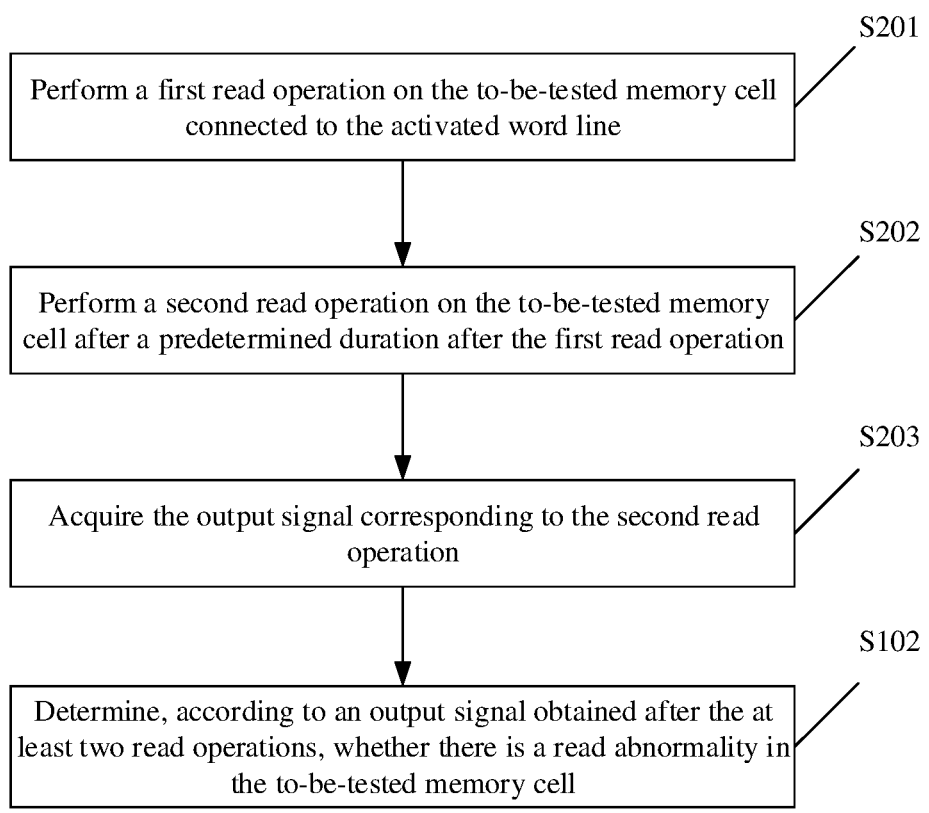
FIG. 2 is the second flowchart of a method for testing a memory according to some embodiments of the present disclosure.

In some embodiments, as shown in FIG. 2, the operation of performing at least two consecutive read operations on the memory cell connected to the activated word line includes the following operations.

In step S201, a first read operation is performed on the memory cell connected to the activated word line.

In step S202, a second read operation is performed on the memory cell after a predetermined duration after the first read operation.

In step S203, the output signal corresponding to the second read operation is acquired.

The above at least two consecutive read operations may be two times, the first read operation may be performed after the addressing and other operations are completed after activating the word line. After activating the word line, the first read operation may be performed at the same time as the read operation in normal use, or it may be performed after a certain duration.

The second read operation may be performed after waiting a predetermined duration after the first read operation. It can be seen that the second read operation is performed later than the first read operation, and the time when the second read operation is performed is later than the time when the read operation is performed in normal use. Therefore, the effect of deteriorating the detection conditions can be implemented. That is to say, when the second read operation is performed, if there is a leakage, the impact of the leakage will be more obvious.

Therefore, after the second read operation is performed, an output signal corresponding to the second read operation may be obtained, and the output signal may more easily reflect whether there is a read abnormality in the memory cell.

In some embodiments, the operation of performing the first read operation includes the following operation.

A first column select signal is generated according to a detected first read instruction to perform the first read operation on the memory cell.

The operation of performing the second read operation includes the following operation.

A second column select signal is generated according to a detected second read instruction to perform the second read operation on the memory cell.

The read operation is performed based on the read instruction. When the read instruction is detected, the memory will generate a column select signal to select and connect a data channel of the bit line, such as strobe local Input/Output bus (LIO), so that the voltage on the bit line can be transmitted to the data processing module of the memory through the data channel.

Therefore, in some embodiments of the present disclosure, after activating the word line, the read operation is performed on the memory cell through the read instruction for multiple times.

In some embodiments, a first read signal is generated by the first read operation, a second read signal is generated by the second read operation, and the operation of acquiring the output signal corresponding to the second read operation includes the following operation.

A sensing process is performed on the second read signal to obtain the output signal.

When data read is not performed, the bit line connected to the memory cell and the reference bit line are both at the same reference voltage Vbleq. When data read needs to be performed, after the activate voltage is applied to the word line connected to the memory cell, the memory cell is activated, so that the charge in the memory capacitor of the memory cell flows to the bit line, and there is a voltage difference between the bit line BL and the reference bit line/BL. However, the voltage difference is too weak to be used as an output signal for data read.

Therefore, in order to obtain the output and data of the read operation, in addition to generating a column select signal when a read instruction is detected, so that the bit line is connected to the data channel. It is also necessary to perform sensing process on the signals on the bit line through a circuit structure such as a sense amplifier, so that the bit line voltage reaches an order of magnitude that can be used as an output signal, and then is output through data channel that is conducted by the above column select signal. Here, the sensing process may be amplifying the signal, or may be other process such as signal conversion. For example, the small voltage signal of the bit line is amplified by the charge stored in the memory cell to obtain an output signal that is easy to identify, and is transmitted to an external data processing module through the data channel after strobe.

In some embodiments of the present disclosure, by performing multiple consecutive strobe operations, the charge output from the memory cell is transmitted to the bit line to generate the read signal, but it is not necessary to perform sensing process to output the read signal every time. Therefore, the sensing process for the read signal may be performed only after the last time of read operation. For example, two consecutive read operations are performed and the second read signal is sensed. The output signal obtained after the last of read operation sensing process is output through the above output channel.

For the case that the entire circuit is normal, the read operation will cause the charge of the memory cell to flow to the bit line, so that there is a voltage difference between the bit line and the reference bit line. If the read operation is performed again, there will still be a voltage difference between the bit line and the reference bit line. At this time, the amplifying process may be performed on the voltage signal between the bit line and the reference bit line, such as the above second read signal, so that the signal on the bit line is amplified to be an output signal, thereby obtaining an output result. Exemplarily, if the data stored in the memory cell is "1", after multiple consecutive read operations are performed, a read signal greater than the reference voltage Vbleq (for example, the reference voltage is 0.5V) is generated on the bit line, so that an voltage difference ΔV is generated between the bit line and the reference bit line. At this time, the bit line voltage Vbl is slightly larger than the reference voltage Vbleq. At this time, the sensing process is performed on the read signal by the sense amplifier SA, so that the voltage on the bit line is amplified, for example, a voltage of 1V is obtained, and is transmitted as an output signal. At this time, after the output signal is read by an external data processing module, it may be confirmed that the data stored in the memory cell is the logic "1" according to the bit line voltage being greater than the reference voltage.

However, if there is an abnormality in the circuit connected to the memory cell (for example, the bit line is short-circuited with other bit line or the reference bit line, the sense amplifier is abnormal, or the data channel of the output signal is abnormal, etc.), the correct data may not be acquired from the final output signal output after multiple consecutive read operations.

For example, there is a leakage situation on the bit line read line. The data "1" is pre-stored in the memory cell. During the process of the multiple consecutive read operations, the charge of the memory cell is released to the bit line, and the voltage of the bit line should be pulled up slightly, so that there is a voltage difference ΔV between the bit line and the reference bit line. However, due to the leakage on the bit line, the voltage Vbl on the bit line is not pulled up slightly as normally. At this time, because the voltage difference ΔV between the bit line and the reference bit line is small or there is no voltage difference, the sense amplifier (SA) cannot sense and amplify the signal. That is, the sense amplifier (SA) cannot continue to pull up the voltage Vbl on the bit line. Therefore, finally, the data read by the external data processing module may be the logic "0". At this time, an abnormality can be detected through the difference between the read data and the pre-stored data.

Correspondingly, if data "0" is pre-stored in the memory cell, during the multiple consecutive read operations, the charge of the memory cell is released to the bit line, so that there is a voltage difference-AV between the bit line and the reference bit line. However, due to the leakage on the read line, the voltage Vbl on the bit line is not pulled down slightly as normally, so that the voltage difference-AV between the reference bit line and the bit line becomes smaller or there is no voltage difference. At this time, similarly, the sense amplifier (SA) also cannot sense and amplify the signal. That is, the sense amplifier (SA) cannot continue to pull down the voltage Vbl on the bit line and simultaneously pull up the signal V/bl on the reference bit line, and the output result may be may be the logic "1", which causes the abnormality that the read data is different from the pre-stored data.

It should be understood that if read operation is performed only once under the condition that the above abnormality exists, the impact of short circuit on the voltage on the bit line has not been reflected. Therefore, the voltage on the bit line may still be amplified and output by the sense amplifier as normally, so that the result of the reading is the correct logic "1", resulting in misdetection. However, through the method in the embodiments of the present disclosure, the condition for reading data is deteriorated through multiple consecutive read operations, and the existing abnormality will be amplified, which will make it easier to be read out, thereby reducing the probability of misdetection and improving detection accuracy.

In some embodiments, the output signal is transmitted to a global output bus through a local output bus.

The local output bus may be located in the peripheral circuit of the memory, connected with various word lines, and connected with the external data processing module through the global output bus. The output signal may be transmitted to the global data bus (Global Input/Output, GIO) through the local output bus (LIO), and then is processed by the data processing module.

In some embodiments, the operation of performing the sensing process on the second read signal includes a pull-up process or a pull-down process.

Exemplarily, if the voltage difference between the bit line voltage and the reference voltage is positive after the memory cell performs charge sharing, that is, the second read signal on the bit line is greater than the reference voltage, the pull-up process may be performed on the second read signal through the sense amplifier, so that the second read signal is much greater than the reference voltage. At this time, correspondingly, the obtained output signal is the logic "1" (this is only an example, and the voltage corresponding to the logic data may also be set according to actual needs).

Correspondingly, if the voltage difference between the bit line voltage and the reference voltage is negative after the memory cell performs charge sharing, that is, the second read signal on the bit line is smaller than the reference voltage, the pull-down process may be performed on the second read signal through the sense amplifier, so that the second read signal is much less than the reference voltage. At this time, correspondingly, the obtained output signal is the logic "0".

In some embodiments, the output signal includes a high level signal or a low level signal.

The read weak signal may be pulled up or pulled down through the sense amplifier to obtain a high level signal or a low level signal that can be clearly distinguished. Different output signals may represent different data, for example, a high level signal represents a logic "1", and a low level signal represents a logic "0"

Therefore, by comparing the logic data represented by the output signal with the pre-stored data, it may be determined whether there is above read abnormality in the memory cell, thereby facilitating further investigation of the cause or processing of abnormal products.

In some embodiments, the second read signal includes a voltage signal, and the operation of performing the sensing process on the second read signal to obtain the output signal includes the following operations.

The sensing process is performed on the second read signal, and a voltage signal after the sensing process is compared with a reference signal.

The output signal of the high level signal is acquired in response to the voltage signal being higher than the reference signal.

The output signal of the low level signal is acquired in response to the voltage signal being lower than the reference signal.

In some embodiments of the present disclosure, the voltages of the bit line and the reference bit line are usually equal to the same reference voltage in the non-read/write state, that is, the voltage value of the reference signal. However, after performing reading process and sensing process, one of the bit line voltage and the reference bit line voltage is greater than the reference voltage, and the other is less than the reference voltage.

Therefore, by performing sensing process on the voltage signal of the bit line, it may be detected whether the bit line voltage is higher than the voltage of the reference signal. If the voltage signal after performing sensing process is higher than the reference signal, the output signal is a high level signal. At this time, exemplarily, when the external signal processing module receives a high level signal through the data bus, it can identify that the read data is "1" (or "0"). If the voltage signal after performing sensing process is lower than the reference signal, the output signal is a low level signal. Exemplarily, at this time, when the external signal processing module receives a low level signal through the data bus, it can identify that the read data is "0" (or "1").

Figure 3:
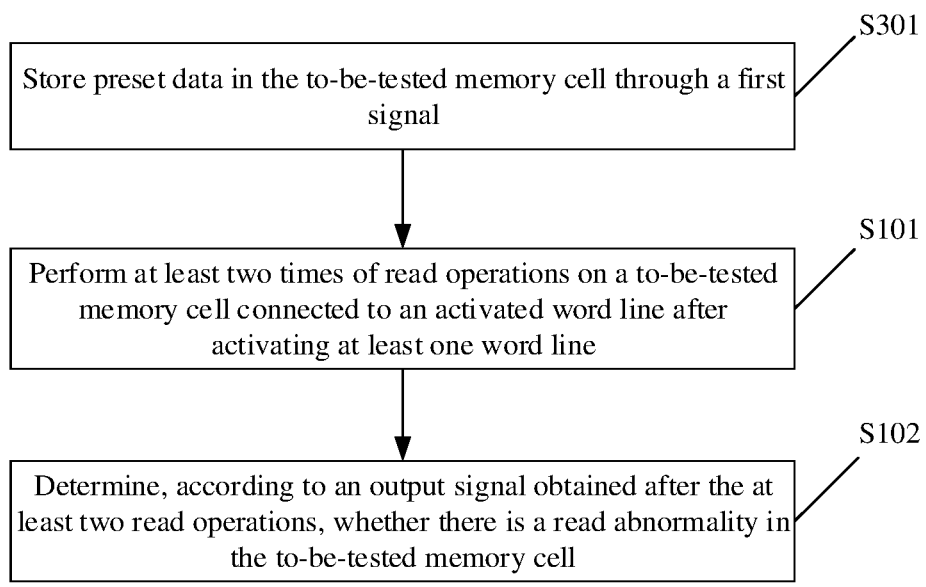
FIG. 3 is the third flowchart of a method for testing a memory according to some embodiments of the present disclosure.

In some embodiments, as shown in FIG. 3, before activating the word line, the method further includes the following steps:

In step S301, Preset data is stored in the memory cell through a first signal. The first signal includes a high level signal or a low level signal.

Before activating the word line to read data, data "1" or data "0" may be pre-stored in the memory cell. Then, during subsequent reading, it may be determined whether the memory cell and related circuits are abnormal according to whether the read data is the same as the pre-stored data.

In the process of writing the pre-stored data, the first signal may be input into the memory cell, so that the corresponding charge is stored in the memory capacitor and other components of the memory cell. Exemplarily, when data "1" is written, it may be written by a high level signal, and when data "0" is written, it may be written by a low level signal.

In some embodiments, the operation of determining whether there is the read abnormality in the memory cell includes the following operations.

Whether the output signal is consistent with a first signal corresponding to the data stored in the memory cell is determined. It is determined that there is the read abnormality in response to the output signal being inconsistent with the first signal.

In some embodiments of the present disclosure, voltage signals of the same polarity or magnitude may be used to represent the same input data or output data. Exemplarily, if the memory cell and its peripheral circuits are normal, the first signal used to pre-store data in the memory cell is consistent with the output signal obtained by reading. Therefore, it is determined whether there is abnormality in the memory cell and its peripheral circuits by determining whether the output signal is consistent with the first signal corresponding to the stored data. If it is inconsistent, it may be determined that the memory cell or the peripheral circuit connected to the memory cell has various possible problems, such as leakage, short circuit, disconnection, abnormality of the sense amplifier, and so on.

In this way, by writing data and then performing multiple consecutive read operations, then rapid and accurate abnormality detection may be performed by outputting signal, thereby facilitating subsequent further testing or processing of the product.

In some embodiments, a plurality of the memory cells are sequentially arranged on the same word line, and the first signals of at least two adjacent memory cells in the plurality of memory cells are different.

In some embodiments of the present disclosure, multiple memory cells on the same word line may be tested. Since the multiple memory cells on the same word line may be short-circuited or leaked to each other, data stored in at least two memory cells in the plurality of memory cells are different by adopting different first signals.

In this way, it can reduce the situation that the leakage is not obvious due to the same pre-stored data, and the abnormality cannot be detected.

In some embodiments, the first signals of any two adjacent memory cells are different.

If the memory cells on the same word line are adjacent, different first signals are adopted. Exemplarily, a plurality of memory cells are adjacent on one word line, and the first signals of various memory cells are alternately provided with a high level signal and a low level signal. In this way, the pre-stored data is arranged in a regularity similar to "101010 . . . ". In this way, if there is leakage between adjacent memory cells, it will be easier to detect, thereby improving the detection accuracy.

In addition, in order to detect more accurately, the steps of multiple consecutive storing data, multiple consecutive reading and detecting output signals may also be performed on various memory cells on the same word line. Different data are pre-stored in each detection process, for example, the pre-stored data for the first detection is "101010 . . . ", the pre-stored data for the second detection is "010101 . . . ", and the pre-stored data for the third detection is "111111 . . . ", the pre-stored data for the fourth detection is "000000 . . . " and so on. Through the regularity of the pre-stored data for each time of detection and the different situations of the output signals, the possible abnormality may be determined more accurately. For multiple word lines (such as WL0-WL3 in Table 1 below), various combinations of pre-stored data (take 8 bits as an example) as shown in Table 1 below may be used for detection.

TABLE 1

Pre-stored data of the to-be-tested memory cells on various word lines

| | data group 1 | data group 2 | data group 3 | data group 4 | data group 5 | data group 6 |
|---|---|---|---|---|---|---|
| WL1 | 10101010 | 01010101 | 11001100 | 00110011 | 11110000 | 00001111 |
| WL2 | 10101010 | 01010101 | 11001100 | 00110011 | 11110000 | 00001111 |
| WL3 | 10101010 | 01010101 | 11001100 | 00110011 | 11110000 | 00001111 |
| WL4 | 10101010 | 01010101 | 11001100 | 00110011 | 11110000 | 00001111 |

In some embodiments, before activating the word line, the method further includes the following operations.

Preset data is stored in the plurality of memory cells connected by the same word line simultaneously through the first signal.

When preset data is stored in the memory cell, a activate voltage needs to be applied to the corresponding word line, so that various memory cells connected to the word line are activated, so that data can be written into the memory cell. In some embodiments of the present disclosure, during the process of applying the activate voltage to the word line, the preset data may be stored in the plurality of memory cells simultaneously. That is, the first signals required to store data may be transmitted through the plurality of bit lines connected to the plurality of memory cells simultaneously, so that the plurality of memory cells connected to the word lines store data at the same time. In this way, the speed of storing data is faster, and the detection speed can be improved.

In some embodiments, the state of applying the activate voltage may be maintained for the same word line, and then preset data are stored in batches for a plurality of memory cells connected to the entire word line. For example, data is stored at the speed of writing 8 bit data per one time. That is, after the word line is activated, data is simultaneously written to 8 memory cells, and then data is simultaneously written to the following 8 memory cells, until the memory cells connected to the entire word line are written with the preset data, then the word line is closed. This writing method may be referred to as a "Y-Page" writing method.

Figure 4:
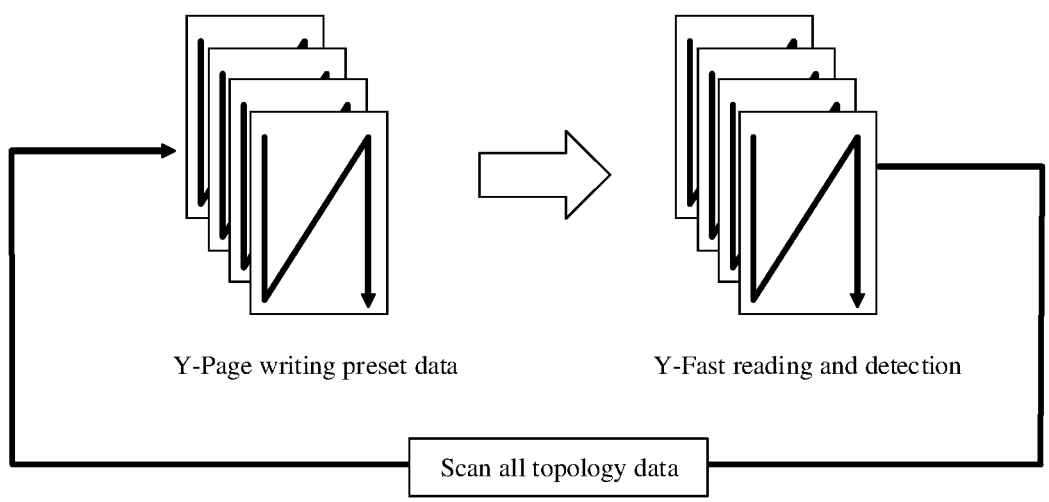
FIG. 4 is a schematic diagram of data writing and reading in a method for testing a memory according to some embodiments of the present disclosure.

It should be understood that, when performing data reading, a data reading operation may also be performed simultaneously on memory cells coupled to a plurality of bit lines (i.e., a plurality of memory cells on the same word line). When one word line is activated, multiple consecutive data read operations of all the memory cells on the word line and the above operation of detecting the output signal are completed, that is, the above "Y-Page" read operation is used. Of course, it is also possible to read 8 bit data at one time (8 memory cells perform detection simultaneously), and then the next group of data is continued to be read after the word line is reactivated. This method is called "Y-Fast" reading method. As shown in FIG. 4, in practical applications, the way to read and write data may be decided according to the actual performance of the product.

In this way, repeated activating and closing of the word line in the process of pre-storing data can be reduced, and the detection efficiency can be improved.

In some embodiments, after the pre-storage of data in various memory cells of one word line is completed, a data read operation may be directly performed on various memory cells on the word line. In this way, the addressing time can be reduced, the detection efficiency can be improved, and at the same time, the signal variation on the word line can be further reduced, power consumption is saved, and the detection speed is fast.

Figure 5:
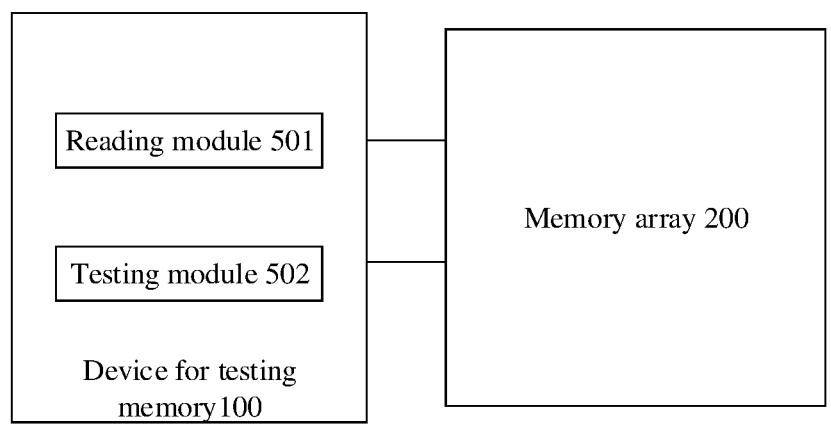
FIG. 5 is a structural block diagram of a device for testing a memory according to some embodiments of the present disclosure.

As shown in FIG. 5, some embodiments of the present disclosure provide a device for testing memory 100, which is connected to a memory array 200 of memory. The device for testing memory 100 includes a reading module and a testing module.

The reading module 501 is configured to perform, after activating at least one word line, at least two consecutive read operations on a memory cell connected to the activated word line.

The testing module 502 is configured to determine, according to an output signal obtained after the at least two consecutive read operations, whether there is a read abnormality in the memory cell.

The reading module and the testing module here may be implemented by various circuit structures in the peripheral circuit of the memory, or may be a control module of an external controller.

In some embodiments, the reading module is configured to: perform a first read operation on the memory cell connected to the activated word line; perform a second read operation on the memory cell after a predetermined duration after the first read operation; and acquire the output signal corresponding to the second read operation.

In some embodiments, the reading module includes an instruction execution module.

The instruction execution module is configured to: generate a first column select signal according to a detected first read instruction to perform the first read operation on the memory cell; and generate a second column select signal according to a detected second read instruction to perform the second read operation on the memory cell.

The relevant descriptions of the functions of the above modules and the execution of the steps have been described in detail in the method embodiments of the present application. Elaborations are omitted herein.

Some embodiments of the present disclosure also provide the following examples.

In some embodiments of the present disclosure, the reading time TRCD is extended by manner of performing multiple consecutive reading, so that the reading conditions of the leakage of the bit line or the abnormality of the sense amplifier are deteriorated, and thus it is easier to be detected.

If there is leakage between the bit lines, the leakage between the bit lines has no impact during normal reading. At this time, the sense amplifier SA can still correctly amplify the signal, so that the output signal is a correct signal. With the method in some embodiments of the present disclosure, after the second read instruction, the leakage between the bit lines has had a significant impact, and it is difficult for the sense amplifier to amplify correct data, resulting in read data errors, and thus abnormality can be detected.

Figure 6:
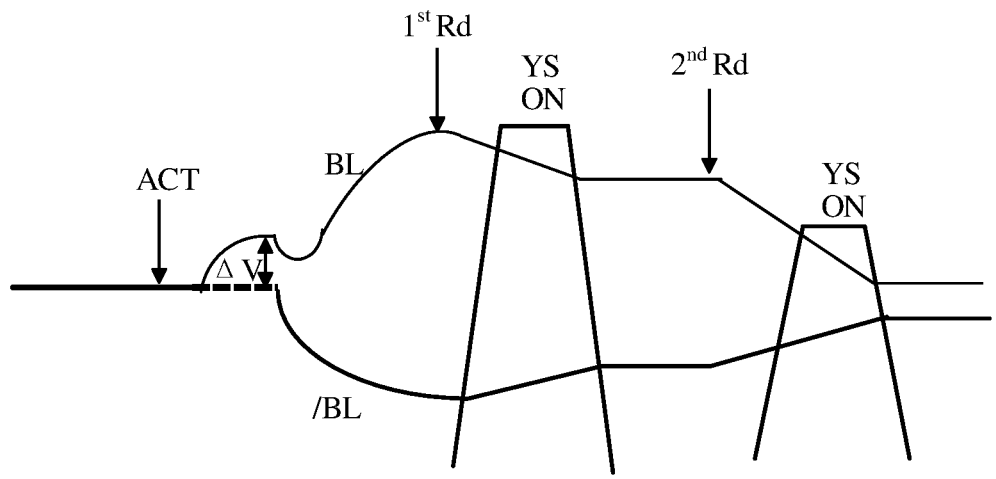
FIG. 6 is the first schematic diagram of the principle of detecting an abnormality in a method for testing a memory according to some embodiments of the present disclosure.

As shown in FIG. 6, after the first read instruction 1st Rd, the bit line and data channel are activated by the column select signal YS. It can be seen that the impact of leakage is not obvious. If the sensing process is performed at this time, the sense amplifier (SA) can still amplify the signal correctly.

Figure 7:
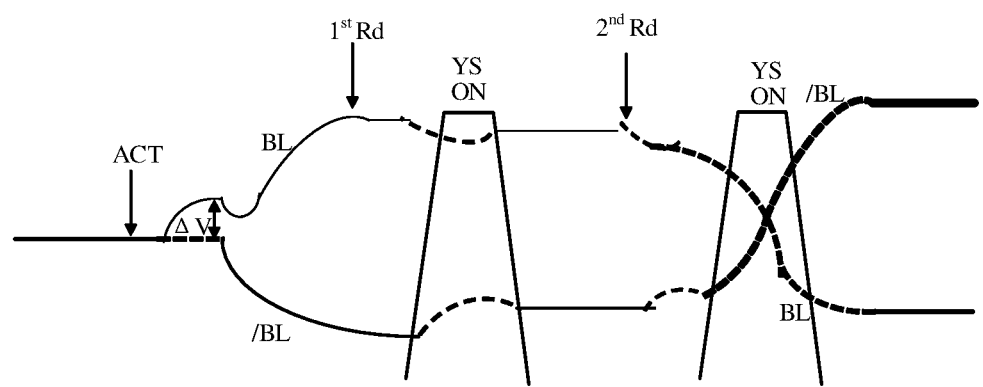
FIG. 7 is the second schematic diagram of the principle of detecting an abnormality in a method for testing a memory according to some embodiments of the present disclosure.

After the second read instruction 2nd Rd, the bit line and the data channel are activated by the column select signal YS. At this time, the leakage between the bit lines is obvious. If the sensing process is performed at this time, it is difficult for the sense amplifier (SA) to amplify the signal, resulting in that the output data is wrong, the signal on the bit line may even be reversely amplified as shown in FIG. 7 due to it is hard for the sense amplifier (SA) to sense the signal correctly, resulting in the wrong output data.

In this way, for the abnormality that cannot be detected in a normal TRCD read operation, some embodiments of the present disclosure can detect the abnormality through two consecutive reading operations, that is, a reading operation after extending the TRCD, thereby reducing the situation of misdetection and facilitating the timely detection and improvement of abnormality.

It should be understood that reference throughout the specification to "one embodiment", "some embodiments" or "the embodiment" means that a particular feature, structure or characteristic associated with the embodiment is included in at least one embodiment of the present disclosure. Thus, appearances of "in one embodiment", "in some embodiments" or "in the embodiment" in various places throughout this specification are not necessarily referring to the same embodiment. Furthermore, the particular features, structures or characteristics may be combined in any suitable manner in one or more embodiments. It should be understood that, in the various embodiments of the present disclosure, the size of the sequence numbers of the above processes does not imply the sequence of execution, and the execution sequences of various processes should be determined by their functions and internal logic, rather than constitute any limitation for the implementation of the embodiments of the present disclosure. The above numbers of the embodiments of the present disclosure are only for description, and do not represent the advantages or disadvantages of the embodiments.

It should be noted that, herein, the terms "comprising", "including" or any other variation thereof are intended to encompass non-exclusive inclusion, such that a process, method, object or device comprising a series of elements includes not only those elements, but also other elements not expressly listed or inherent to such a process, method, object or device. Without further limitation, an element qualified by the phrase "comprising a . . . " does not preclude the presence of additional identical elements in a process, method, object or device that includes the element.

In the several embodiments provided in the present disclosure, it should be understood that the disclosed device and method may be implemented in other manners. The device embodiments described above are only illustrative. For example, the division of the units is only a logical function division. In actual implementation, there may be other division methods. For example, multiple units or components may be combined, or may be integrated into another system, or some features may be ignored, or not implemented. In addition, the coupling, or direct coupling, or communication connection between the components shown or discussed may be indirect coupling or communication connection through some interfaces, devices or units, and they may be electrical, mechanical or other forms.

The unit described above as a separate component may or may not be physically separated, and the component displayed as a unit may or may not be a physical unit. It may be located in one place or distributed to multiple network units. Some or all of the units may be selected according to actual needs to implement the purpose of the solution in the embodiments.

In addition, various functional units in various embodiments of the present disclosure may all be integrated into one processing unit, or each unit may be separately used as a unit, or two or more units may be integrated into one unit; the above integrated unit may be implemented either in the form of hardware or in the form of hardware plus software functional units.

The above is only the embodiments of the present disclosure, but the protection scope of the present disclosure is not limited thereto. Any person skilled in the art who is familiar with the technical scope of the present disclosure can easily think of changes or substitutions, which should cover within the scope of protection of the present disclosure. Therefore, the protection scope of the present disclosure should be subject to the protection scope of the claims.

INDUSTRIAL APPLICABILITY

In the technical solutions of the embodiments of the present disclosure, at least two consecutive read operations are performed in the memory cell, and the detection result is determined based on the finally obtained output signal. By at least two consecutive reading, the reading time may be extended. In the case that there is abnormality in the memory cell, the output signal obtained after multiple consecutive reading operations can more easily reflect the abnormality, which is convenient for detection and improves the detection accuracy, and reduce the situation of misdetection.

The invention claimed is:

1. A method for testing a memory, comprising:
performing, after activating a word line, at least two consecutive read operations on a memory cell connected to the word line to test the memory cell; and
determining, according to an output signal obtained after the at least two consecutive read operations, whether there is a read abnormality in the memory cell;
wherein performing the at least two consecutive read operations on the memory cell connected to the word line comprises:
performing a first read operation on the memory cell connected to the word line;

performing a second read operation on the memory cell after a predetermined duration after the first read operation; and acquiring the output signal corresponding to the second read operation;

wherein performing the first read operation comprises:

generating a first column select signal according to a detected first read instruction to perform the first read operation on the memory cell; and performing the second read operation comprises:

generating a second column select signal according to a detected second read instruction to perform the second read operation on the memory cell.

2. The method of claim 1, wherein a first read signal is generated by the first read operation, a second read signal is generated by the second read operation, and acquiring the output signal corresponding to the second read operation comprises:

performing a sensing process on the second read signal to obtain the output signal.

3. The method of claim 2, wherein performing the sensing process on the second read signal comprises performing a pull-up process or a pull-down process.

4. The method of claim 2, wherein the output signal comprises a high level signal or a low level signal.

5. The method of claim 1, before activating the word line, further comprising:

storing preset data in the memory cell through a first signal, wherein the first signal comprises a high level signal or a low level signal.

6. The method of claim 5, wherein determining whether there is the read abnormality in the memory cell comprises:

determining whether the output signal is consistent with a first signal corresponding to the data stored in the memory cell, and determining that there is the read abnormality in response to the output signal being inconsistent with the first signal.

7. The method of claim 5, wherein a plurality of memory cells are sequentially arranged on a same word line, and at least two adjacent memory cells in the plurality of memory cells have different first signals.

8. The method of claim 7, wherein any two adjacent memory cells in the plurality of memory cells have different first signals.

9. The method of claim 7, before activating the word line, further comprising:

storing, through the first signal, preset data in the plurality of the memory cells connected on the same word line simultaneously.

10. The method of claim 1, wherein the output signal is transmitted to a global output bus through a local output bus.

11. A device for testing a memory, comprising:

a reading module, configured to perform, after activating a word line, at least two consecutive read operations on a memory cell connected to the word line to test the memory cell;

a testing module, configured to determine, according to an output signal obtained after the at least two consecutive read operations, whether there is a read abnormality in the memory cell;

wherein the reading module is configured to:

perform a first read operation on the memory cell connected to the word line;

perform a second read operation on the memory cell after a predetermined duration after the first read operation; and acquire the output signal corresponding to the second read operation;

wherein the reading module comprises:

an instruction execution module, configured to:

generate a first column select signal according to a detected first read instruction to perform the first read operation on the memory cell; and generate a second column select signal according to a detected second read instruction to perform the second read operation on the memory cell.

* * * * *